United States Patent [19]

Kusano et al.

[11] 4,074,299
[45] Feb. 14, 1978

[54] LIGHT-EMITTING DIODE ELEMENT AND DEVICE

[75] Inventors: Masaaki Kusano, Yokohama; Shinzi Okuhara, Fujisawa; Ichiro Ohhinata, Yokohama, all of Japan

[73] Assignee: Hitachi, Ltd., Japan

[21] Appl. No.: 636,452

[22] Filed: Dec. 1, 1975

[30] Foreign Application Priority Data

Dec. 4, 1974 Japan ............................ 49-138382

[51] Int. Cl.² ...................... H01L 33/00; H01L 23/48
[52] U.S. Cl. ..................................... 357/17; 313/500; 357/56; 357/75; 357/80
[58] Field of Search ................. 357/17, 68, 65, 74, 357/55, 56, 75, 80, 30, 32; 313/499, 500

[56] References Cited

U.S. PATENT DOCUMENTS

| | | | |
|---|---|---|---|
| 3,054,034 | 9/1962 | Nelson | 357/56 X |
| 3,518,418 | 6/1970 | Dubois | 313/499 |
| 3,520,054 | 7/1970 | Pensack et al. | 357/74 |
| 3,573,568 | 4/1971 | Siegel | 357/17 |
| 3,614,832 | 10/1971 | Chance et al. | 357/65 |
| 3,641,401 | 2/1972 | Lynch | 357/74 |
| 3,803,460 | 4/1974 | Lebailly | 357/56 X |
| 3,887,760 | 6/1975 | Krieger et al. | 29/626 X |
| 3,964,157 | 6/1976 | Kuhn et al. | 357/17 X |

*Primary Examiner*—Stanley D. Miller, Jr.
*Assistant Examiner*—James W. Davie
*Attorney, Agent, or Firm*—Craig & Antonelli

[57] ABSTRACT

A light-emitting diode element comprises a semiconductor wafer including a pair of a p-type semiconductor region and an n-type semiconductor region forming a pn junction, an inclined first electrode provided on at least one of the peripheral edges of the surface of one of the semiconductor regions in the semiconductor wafer, and a flat second electrode provided on the surface of the other semiconductor region. A light-emitting diode device is provided in which a plurality of such light-emitting diode elements are respectively received in a plurality of openings of a substrate having a first wiring conductor group and a second wiring conductor group electrically connected to the first and second electrodes respectively of the light-emitting diode elements by a low-melting metal. Thus, these light-emitting diode elements can be mounted on the single substrate in a high package density, and the light-emitting diode device of simple construction can be easily assembled.

8 Claims, 9 Drawing Figures

FIG. 1
PRIOR ART
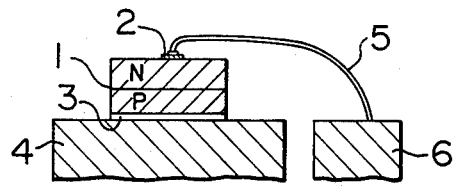
FIG. 2a
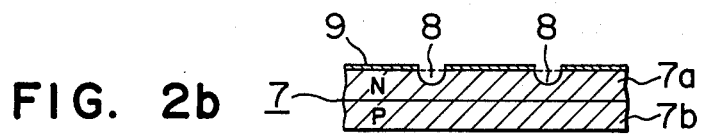
FIG. 2b
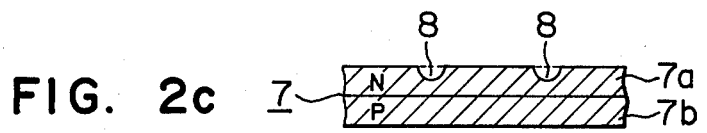
FIG. 2c
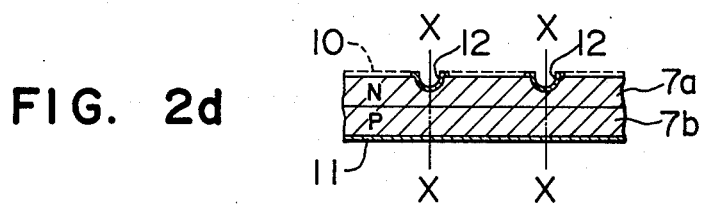
FIG. 2d
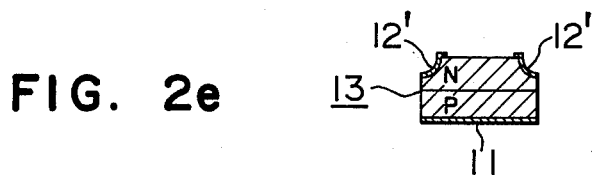
FIG. 2e U.S. Patent  Feb. 14, 1978  Sheet 2 of 2  4,074,299

LIGHT-EMITTING DIODE ELEMENT AND DEVICE

This invention relates to a light-emitting diode element having a pair of a p-type semiconductor region and an n-type semiconductor region forming a pn junction, and to a light-emitting diode device obtained by mounting a plurality of such light-emitting diode elements on a single substrate.

It is known that, when forward current is supplied to an element including a pn junction of a group II – VI or III – V compound semiconductor such as GaAs or GaAlAs for injecting carriers into the pn junction, light of the near infrared or red region is emitted from the pn junction during the recombination of the carriers. Such an element is called a light-emitting diode element and is widely used in the field of electronics. However, due to the fact that known light-emitting diode elements are generally of vertical construction, they cannot be mounted in a manner similar to the manner of mounting of a silicon integrated circuit in which all the electrodes of circuit elements can be formed on one surface of a substrate and which can therefore be mounted as by the so-called face-down bonding. It has therefore been difficult to mount a plurality of such light-emitting diode elements on a single substrate in a high package density with high mounting efficiency.

FIG. 1 is a schematic sectional view of a prior art light-emitting diode device. Referring to FIG. 1, the prior art light-emitting diode device comprises a light-emitting diode element 1 having a pair of an n-type semiconductor region and a p-type semiconductor region forming a pn junction. A first electrode 2 is in ohmic contact with a portion of the surface of the n-type semiconductor region, and a second electrode 3 is in ohmic contact with the entire surface of the p-type semiconductor region. The light-emitting diode element 1 is bonded at the second electrode 3 to a support 4, and the first electrode 2 is wire-bonded to a terminal 6 by a metal wire 5. However, the prior art light-emitting diode device of such a structure has been defective in that, when a plurality of such light-emitting diode elements are arranged on the same substrate in, for example, matrix form, a large space is inevitably used for the electrical connection between the terminals and the associated first electrodes on the surface of the light-emitting n-type semiconductor regions of the diode elements. Occupation of such a large space is especially undesirable when it is desired to provide a miniature light-emitting diode device having these light-emitting diode elements mounted thereon in a high package density. Further, mounting of these light-emitting diode elements has been very troublesome and time-consuming since each diode element must be wire-bonded to the associated terminal.

It is an object of the present invention to provide a novel and improved light-emitting diode element which is free from prior art defects as pointed out above.

Another object of the present invention is to provide a novel and improved light-emitting diode device in which a plurality of such light-emitting diode elements can be mounted on a single substrate in a high package density.

Still another object of the present invention is to provide a light-emitting diode element which can be easily mounted.

Yet another object of the present invention is to provide a light-emitting diode device which can be easily assembled.

In accordance with one aspect of the present invention, there is provided a light-emitting diode element comprising a semiconductor wafer including a pair of a p-type semiconductor region and an n-type semiconductor region forming a pn junction, at least one of the peripheral edges of the surface of one of said semiconductor regions in said semiconductor wafer being beveled to provide a beveled area contiguous to said surface, a first electrode provided on said beveled area, and a second electrode provided on the surface of the other said semiconductor region.

In accordance with another aspect of the present invention, there is provided a light-emitting diode device comprising a light-emitting diode element comprising a semiconductor wafer including a pair of a p-type semiconductor region and an n-type semiconductor region forming a pn junction, an inclined first electrode provided on a beveled area formed by removing a portion of at least one of the peripheral edges of the surface of one of said semiconductor regions in said semiconductor wafer, and a flat second electrode provided on the surface of the other said semiconductor region, and a substrate comprising an opening for receiving said light-emitting diode element therein, a first wiring conductor strip disposed to extend around the top end of said opening, and a second wiring conductor strip disposed to extend along the bottom end of said opening, said light-emitting diode element being received in said opening in such a relation that said second electrode is opposed directly by said second wiring conductor strip, and said first and second electrodes are electrically connected to said first and second wiring conductor strips respectively.

The present invention will be apparent from the following detailed description taken in conjunction with the accompanying drawings, in which:

FIG. 1 is a schematic sectional view of a prior art light-emitting diode device;

FIGS. 2a to 2e show successive steps for forming electrodes in a preferred form of the light-emitting diode element according to the present invention;

Figure 3:
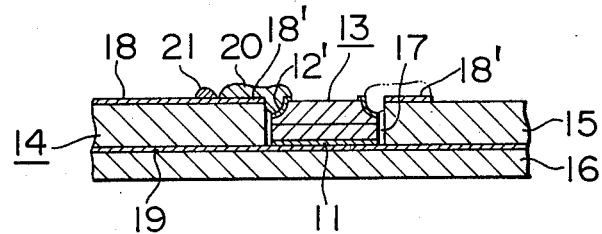
FIG. 3 is a schematic sectional view of a preferred embodiment of the light-emitting diode device according to the present invention.

Referring to FIG. 2a, a semiconductor wafer 7 is prepared by any suitable known method and consists of an n-type semiconductor region 7a and a p-type semiconductor region 7b forming a pn junction. The material of this semiconductor wafer 7 may be a compound of a group III element, for example, Ga and a group V element, for example, As. As shown in FIG. 2b, a mask of photo-resist film 9 is deposited on the exposed surface of the n-type semiconductor region 7a of the wafer 7, and etching is applied through the photo-resist film 9 to the n-type semiconductor region 7a to provide a plurality of lattice-like extending grooves 8 which are spaced apart from each other by a predetermined distance. The photo-resist film 9 is then removed to leave a structure as shown in FIG. 2c. Then, as shown in FIG. 2d, metal layers 10 and 11 are deposited on the opposite surfaces respectively of the wafer 7 as by evaporation so as to provide a first electrode and a second electrode which make ohmic contact with the opposite surfaces respectively of the wafer 7. The electrode metal layer 10, except the electrode portions 12 deposited in the grooves 8, is then removed by the known photo-etching technique, and the wafer 7 is cut along the lines X — X as shown in FIG. 2d. Consequently, a light-emitting diode element 13 is obtained in which the first electrode 12' is deposited on the beveled edge portions of the surface of the n-type semiconductor region 7a as shown in FIG. 2e.

FIG. 3 is a schematic sectional view of a preferred embodiment of the light-emitting diode device according to the present invention, in which the light-emitting diode element 13 obtained by the steps shown in FIGS. 2a to 2e is bonded to a substrate 14.

Referring to FIG. 3, this substrate 14 is composed of a pair of ceramic sheets 15 and 16 superposed on each other. The ceramic sheet 15 is formed with an opening 17, such as by being boxed, for receiving the light-emitting diode element 13 therein. The depth of this opening 17 is approximately equal to the height of the light-emitting diode element 13. A first wiring conductor strip 18 is disposed on the exposed surface of the ceramic sheet 15 so as to surround the top end of the opening 17 at the end portion 18' thereof. A second wiring conductor strip 19 is disposed on the surface of the ceramic sheet 16 at which the latter is bonded to the ceramic sheet 15. Thus, the second wiring conductor strip 19 extends along the bottom end of the opening 17. Such a substrate structure can be obtained by a known method similar to that applied customarily to conventional ceramic substrates. The second electrode 11 of the light-emitting diode element 13 is electrically connected by ultrasonic welding or any other suitable means to the second wiring conductor strip 19 extending along the bottom end of the opening 17 of the ceramic sheet 15. The first electrode 12' is electrically connected by a bridge of solder 20 to the first wiring conductor strip 18 which is disposed on the surface of the ceramic sheet 15 and whose end portion 18' surrounds the top end of the opening 17. An electrical insulator 21 such as glass, which is not bonded to the solder, is deposited across the first wiring conductor strip 18 so as to prevent flow of the solder 20 and to maintain constant the amount of the solder 20 applied for establishing the electrical connection.

In the light-emitting diode device of the present invention described with reference to FIG. 3, the first electrode 12' is provided on the beveled area formed by partly removing the peripheral edges of one of the surfaces of the light-emitting diode element 13, and on the other surface of this diode element 13' the second electrode 11 is provided. Further, the top end of the opening 17 of the substrate 14 is surrounded by the end portion 18' of the first wiring conductor strip 18, while the bottom end of this opening 17 is associated with the second wiring conductor strip 19. Thus, during assembling, a troughlike recess is formed around the first electrode 12' of the light-emitting diode element 13 as seen in FIG. 3 which the light-emitting diode element 13 is received in the opening 17 of the substrate 14. This trough-like recess is effective in facilitating the assembling due to the fact that the bridge of the solder 20 for electrically connecting the first electrode 12' to the first wiring conductor strip 18 can be easily provided.

Figure 4:
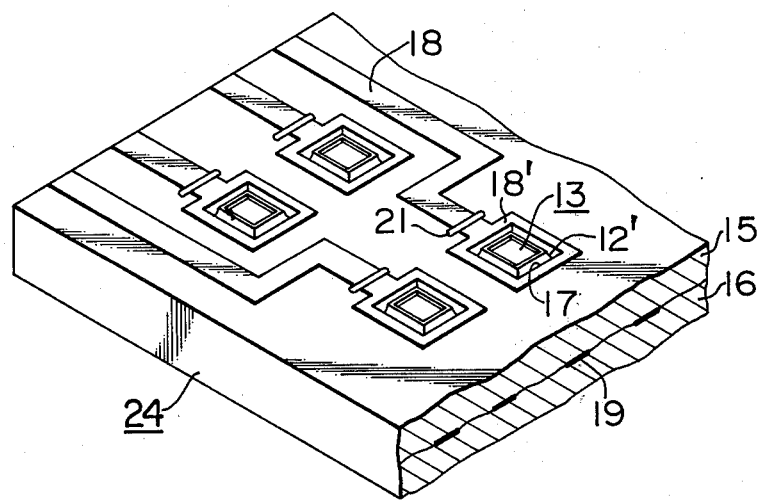
FIG. 4 is a schematic perspective view of part of another preferred embodiment of the present invention.

FIG. 4 is a schematic perspective view of part of another preferred embodiment of the light-emitting diode device according to the present invention. In FIG. 4, like reference numerals are used to denote like parts appearing in FIG. 3. In this second embodiment, a plurality of light-emitting diode elements 13 each as shown in FIG. 2e are disposed on a single substrate 24 having a plurality of receiving openings 17. Although solder bridges for electrically connecting individual first electrodes 12' of the light-emitting diode elements 13 to associated first wiring conductor strips 18 disposed on one surface of the substrate 24 are not shown for simplicity of illustration, it is apparent that each of these first electrodes 12' is actually electrically connected to the first wiring conductor strip 18 by a bridge of solder 20 similar to that shown in FIG. 3.

The light-emitting diode device shown in FIG. 4 can be very easily assembled as in the case of the first embodiment of the present invention shown in FIG. 3. Further, the light-emitting diode elements can be efficiently mounted on the single substrate in a high package density.

Figure 5:
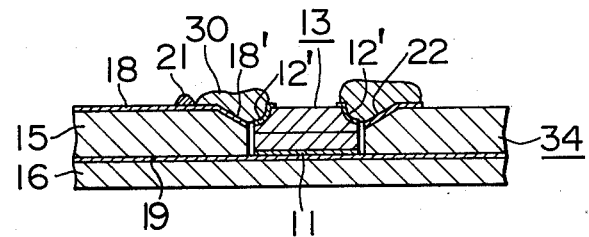
FIG. 5 is a schematic sectional view of still another preferred embodiment of the present invention.

FIG. 5 is a schematic sectional view of still another preferred embodiment of the light-emitting diode device according to the present invention. In FIG. 5, like reference numerals are used to denote like parts appearing in FIG. 3. In this third embodiment, a light-emitting diode element 13 as shown in FIG. 2e is bonded to a substrate 34. This substrate 34 differs slightly from the substrates 14 and 24 shown in FIGS. 3 and 4 in that the peripheral edges of the top end of a receiving opening 17 are partly removed to provide a beveled area 22 as shown, and a wiring conductor strip 18' is disposed on this beveled area 22 as an extension of a first wiring conductor strip 18.

A second electrode 11 of the light-emitting diode element 13 received in the opening 17 of the substrate 34 is electrically connected by ultrasonic welding or any other suitable means to a second wiring conductor strip 19 extending along the bottom end of the opening 17. A first electrode 12' of the light-emitting diode element 13 is electrically connected by a bridge of solder 30 to the wiring conductor strip 18' disposed on the beveled area 22 formed by partly removing the peripheral edges of the top end of the opening 17.

During assembling of the light-emitting diode device shown in FIG. 5, a trough-like recess is formed between the first electrode 12' provided on the beveled area of the light-emitting diode element 13 and the wiring conductor strip 18' provided on the beveled area 22 formed by partly removing the peripheral edges of the top end of the opening 17 of the substrate 34, when the light-emitting diode element 13 is received in the opening 17 of the substrate 34. This trough-like recess can be utilized to ensure a soldered electrical connection better than that shown in FIG. 3.

In the embodiments above described, the n-type semiconductor region of the light-emitting diode element is beveled at all the peripheral edges of the surface thereof, and the first electrode is provided to extend over the entire beveled area of the surface of the n-type semiconductor region. This first electrode is provided on the n-type semiconductor region because the light-emitting efficiency of the light-emitting diode element is generally better when light is derived from the n-type semiconductor region than when light is derived from the p-type semiconductor region. However, the p-type semiconductor region of the light-emitting diode element may be beveled at the peripheral edges of the surface thereof, and the first electrode may be provided on such beveled area in lieu of being provided on the n-type semiconductor region.

Further, although the first electrode is provided to extend over the entire beveled area of the surface of the n-type semiconductor region of the light-emitting diode element in the embodiments above described, all the portions of this first electrode need not necessarily be electrically connected to the conductor strip, and at least one portion of the first electrode may merely be electrically connected to the conductor strip. Further, the embodiments have referred to the case in which the light-emitting diode element is rectangular in configuration. However, this configuration is not limited to the rectangular one illustrated in the drawing and may be circular or triangular. In such a case, the opening of the substrate should be shaped to conform to the configuration of the light-emitting diode element.

It will be understood from the foregoing detailed description that the present invention provides a light-emitting diode element which is obtained by preparing a semiconductor wafer including a pair of a p-type semiconductor region and an n-type semiconductor region forming a pn junction, providing a first electrode on a beveled area of the surface of one of the semiconductor regions, and providing a second electrode on the surface of the other semiconductor region. It will be understood further that the present invention provides a light-emitting diode device which is obtained by preparing a substrate having an opening for receiving such a light-emitting diode element therein, disposing a first wiring conductor strip having an extension surrounding the top end of the opening of the substrate for electrical connection with the first electrode of the light-emitting diode element utilizing a bridge of solder, and disposing a second wiring conductor strip along the bottom end of the opening of the substrate for electrical connection with the second electrode of the light-emitting diode element utilizing ultrasonic welding or the like. A plurality of such openings may be provided on the same substrate so that a plurality of such light-emitting diode elements can be mounted on the single substrate in a high package density.

One practical process for mounting may comprise previously placing a small piece of solder (a thin strip or ball or solder) in each of the openings of the substrate, inserting the light-emitting diode element into each of the openings, putting a small piece of solder (a thin strip or ball of solder) in the trough-like recess formed between each of the first wiring conductor strips disposed on the surface of the substrate and the first electrode of the corresponding light-emitting diode element, and passing the entire substrate through a heating furnace by conveying the same on a belt conveyor. Another practical process for mounting may comprise electrically connecting the second electrode of each of the light-emitting diode elements to the associated second wiring conductor strip disposed along the bottom end of the opening as by ultrasonic welding, and immersing the substrate in a bath of molten solder for electrically connecting the first electrode of each of the light-emitting diode elements to the associated first wiring conductor strip disposed on the surface of the substrate. In this manner, a plurality of light-emitting diode elements of the structure above described can be simultaneously electrically connected to the wiring within a short period of time. Thus, the mounting efficiency can be greatly improved which provides a great economical merit. It is apparent that, in lieu of the solder, any other suitable low-melting metal may be used.

What is claimed is:

1. A light-emitting diode device comprising a light-emitting diode element comprising a rectangularly-shaped semiconductor wafer including a pair of a p-type semiconductor region and an n-type semiconductor region forming a pn junction, an inclined first electrode provided on a beveled area formed by removing a portion of at least one of the peripheral edges of the surface of one of said semiconductor regions in said semiconductor wafer, and a flat second electrode provided on the surface of the other said semiconductor region, and a substrate which comprises a rectangularly-shaped opening for receiving said light-emitting diode element therein, a first wiring conductor strip disposed to extend around the top end of said opening, and a second wiring conductor strip disposed to extend along the bottom end of said opening, said light-emitting diode element being received in said opening of said substrate in such a relation that said second electrode directly faces said second wiring conductor strip, and said first and second electrodes are electrically connected to said first and second wiring conductor strips respectively, said first electrode being electrically connected to said first wiring conductor strip by a bridge of low melting point metal.

2. A light-emitting diode device as claimed in claim 1, wherein said substrate consists of a first ceramic sheet and a second ceramic sheet each having a conductor strip on one surface thereof and superposed on each other in such a relation that the non-conductor bearing surface of said first ceramic sheet is bonded to the conductor bearing surface of said second ceramic sheet, said opening being formed in said first ceramic sheet, and the conductor strip on the surface of said first ceramic sheet and the conductor strip on the surface of said second ceramic sheet are arranged in predetermined patterns to provide said first and second wiring conductor strips respectively.

3. A light-emitting diode device as claimed in claim 1, wherein said inclined first electrode of said light-emitting diode element is provided to extend over all the peripheral edges of the surface of one of said semiconductor regions in said semiconductor wafer.

4. A light-emitting diode device as claimed in claim 1, wherein said opening of said substrate is beveled at the area opposite to said first electrode of said light-emitting diode element, and a wiring conductor strip is disposed along said beveled area, as an extension of said first wiring conductor strip.

5. A light-emitting diode device as claimed in claim 1, wherein said first and second electrodes of said light-emitting diode element are provided on said n-type and p-type semiconductor regions respectively in said semiconductor wafer.

6. A light-emitting diode device as claimed in claim 1, wherein said birdge of low-melting point metal is electrically connected between the first electrode and the first wiring conductor strip, and said bridge is a bridge of solder.

7. A light-emitting diode device comprising a plurality of light-emitting diode elements each comprising a rectangularly-shaped semiconductor wafer including a pair of a p-type semiconductor region and an n-type semiconductor region forming a pn junction, an inclined first electrode provided on a beveled area formed by removing a portion of at least one of the peripheral edges of the surface of said n-type semiconductor region in said semiconductor wafer, and a flat second electrode provided on the surface of said p-type semiconductor region, and a substrate comprising a first ceramic sheet and a second ceramic sheet each having a plurality of wiring conductor strips on one surface thereof and superposed on each other in such a relation that the non-conductor bearing surface of said first ceramic sheet is bonded to the conductor bearing surface of said second ceramic sheet, and a plurality of rectangularly-shaped openings formed in said first ceramic sheet for receiving said light-emitting diode elements therein, each said light-emitting diode element being received in the corresponding opening of said substrate in such a relation that said second electrode directly faces one of said wiring conductor strips disposed on said second ceramic sheet providing the bottom of said opening, and said first and second electrodes are respectively electrically connected to the associated ones of said wiring conductor strips disposed on the surface of said first and second ceramic sheets constituting said substrate, said first electrodes being electrically connected to associated ones of said wiring conductor strips by a bridge of low melting point metal.

8. A light-emitting diode device as claimed in claim 7, wherein each said opening of said substrate is beveled at the area opposite to said first electrode of each said light-emitting diode element, and a wiring conductor strip is disposed along said beveled area as an extension of each said wiring conductor strip disposed on the surface of said first ceramic sheet.

* * * * *